United States Patent [19]
Bruce et al.

[11] Patent Number: 5,683,761
[45] Date of Patent: Nov. 4, 1997

[54] ALPHA ALUMINA PROTECTIVE COATINGS FOR BOND-COATED SUBSTRATES AND THEIR PREPARATION

[75] Inventors: Robert W. Bruce, Loveland; Mark A. Rosenzweig, Hamilton; Bangalore A. Nagaraj, West Chester; Jon C. Schaeffer, Milford, all of Ohio; William B. Connor, Clifton Park, N.Y.; David J. Wortman, Hamilton, Ohio

[73] Assignee: General Electric Company, Cincinnati, Ohio

[21] Appl. No.: 450,647

[22] Filed: May 25, 1995

[51] Int. Cl.[6] ............................................. C23C 16/40
[52] U.S. Cl. .................. 427/596; 427/255.7; 427/419.2
[58] Field of Search .......................... 427/255.3, 255.7, 427/419.1, 419.2, 596, 126.3, 126.1, 126.4

[56] References Cited

U.S. PATENT DOCUMENTS

| | | | |
|---|---|---|---|
| 3,442,686 | 5/1969 | Jones | 117/70 |
| 4,095,003 | 6/1978 | Weatherly et al. | 427/34 |
| 4,321,311 | 3/1982 | Strangman | 428/623 |
| 4,405,659 | 9/1983 | Strangman | 427/248.1 |
| 4,405,660 | 9/1983 | Ulion et al. | 457/248.1 |
| 4,414,249 | 11/1983 | Ulion et al. | 427/248.1 |
| 4,481,237 | 11/1984 | Bosshart et al. | 427/376.4 |
| 4,576,874 | 3/1986 | Spengler et al. | 428/623 |
| 4,676,994 | 6/1987 | Demaray | 427/42 |
| 4,743,514 | 5/1988 | Strangman et al. | 428/678 |
| 4,855,603 | 8/1989 | Lindmayer | 250/484.1 |
| 4,880,614 | 11/1989 | Strangman et al. | 428/623 |
| 5,055,319 | 10/1991 | Bunshah et al. | 427/38 |
| 5,087,477 | 2/1992 | Giggins, Jr. et al. | 427/38 |
| 5,147,731 | 9/1992 | Gilmore et al. | 428/633 |
| 5,338,577 | 8/1994 | Burdette, II | 427/453 |
| 5,407,705 | 4/1995 | Vakil | 427/255 |
| 5,434,008 | 7/1995 | Felts | 428/461 |
| 5,538,796 | 7/1996 | Schaffer et al. | 428/469 |

OTHER PUBLICATIONS

Grant, Julius, ed., *Hackh's Chemical Dictionary*, 1969, pp. 31–32.

*Primary Examiner*—Kathryn L. Gorgos
*Assistant Examiner*—Chrisman D. Carroll
*Attorney, Agent, or Firm*—Andrew C. Hess; David L. Narciso

[57] ABSTRACT

A bond-coated substrate is protected with an alpha alumina layer. The alpha alumina layer may be deposited as a relatively thick layer directly onto the bond-coated substrate. In this embodiment, no further ceramic layer overlies the alpha alumina layer. Other ceramics may be mixed into the alpha alumina layer, however. In another embodiment, a layer of a ceramic other than alpha alumina is deposited over the bond-coated substrate, and an alpha alumina layer is deposited over the ceramic layer.

18 Claims, 2 Drawing Sheets

ALPHA ALUMINA PROTECTIVE COATINGS FOR BOND-COATED SUBSTRATES AND THEIR PREPARATION

BACKGROUND OF THE INVENTION

This invention relates to the protection of substrates, and, more particularly, to thermal barrier coating systems for superalloys used in gas turbine engines.

In an aircraft gas turbine (jet) engine, air is drawn into the front of the engine, compressed by a shaft-mounted compressor, and mixed with fuel. The mixture is burned, and the hot exhaust gases are passed through a turbine mounted on the same shaft. The flow of gas turns the turbine, which turns the shaft and provides power to the compressor. The hot exhaust gases flow from the back of the engine, driving it and the aircraft forwardly.

The hotter the exhaust gases, the more efficient is the operation of the jet engine. There is thus an incentive to raise the exhaust combustion gas temperature. However, the maximum temperature of the combustion gases is normally limited by the materials used to fabricate the turbine vanes and turbine blades of the turbine, upon which the combustion gases impinge when they are at their hottest temperatures. In current engines, the turbine vanes and blades are made of nickel-based superalloys, and can operate at temperatures of up to 1900–2100 F.

Many approaches have been used to increase the operating temperature limit of the turbine blades and vanes to their current levels. The composition and processing of the materials themselves have been improved, and physical cooling techniques are used.

In another approach, a protective thermal barrier coating system is applied to the turbine blade or turbine vane component, which serves as a substrate. The thermal barrier coating system includes a ceramic thermal barrier coating that insulates the component from the hot exhaust gas, permitting the exhaust gas to be hotter than would otherwise be possible with the particular material and fabrication process of the component. An additional layer called a bond coat is placed between the substrate and the thermal barrier coating to aid in adhering the ceramic thermal barrier coating to the substrate and to protect the substrate against contact with the exhaust gases and against oxidation.

In current practice, the ceramic thermal barrier coating is made of zirconia (zirconium oxide) that is stabilized with the addition of from about 6 to about 8 weight percent yttria (yttrium oxide), a material known as yttria-stabilized zirconia or YSZ. While operable, the YSZ is relatively dense compared to many other ceramics. High density is a disadvantage, particularly for use on rotating components such as turbine blades. Moreover, there is a continuing search for ceramic materials and configurations of the protective coating with improved erosion and impact resistance to the hot gas environment and that, in combination with the bond coat, contribute to improved performance of the protected article.

SUMMARY OF THE INVENTION

The present invention provides a protected article and a method for its preparation. The protection is provided by a coating system utilizing a ceramic overcoating layer and a bond coat between the ceramic overcoating layer and the substrate. The protective system is less dense than a conventional thermal barrier coating system, and it can therefore be made thicker to provide superior thermal insulation, without adding weight. The protective coating of the invention has equivalent or superior erosion resistance and corrosion resistance, as well as better overall oxidation protection of the substrate, as compared with a conventional coating system.

In accordance with one aspect of the invention, a protected article comprises a substrate, a metallic bond coat on the substrate, and a protective coating comprising alpha alumina on the bond coat, with no further ceramic material layer over the alpha alumina coating. In one form of this embodiment, the ceramic thermal barrier coating is alpha alumina, either solely or with another ceramic or other ceramics mixed with the alpha alumina. This embodiment takes full advantage of the low density of the alpha alumina and its protective, erosion-resistant qualities. Alpha alumina has a lower density but higher thermal conductivity than many other ceramic materials such as yttria-stabilized zirconia. It is therefore preferably applied as a thicker coating than the ceramic coating used in conventional thermal barrier coating systems to achieve equivalent or superior thermal protection, to achieve superior erosion resistance, impact resistance, and oxidation protection of the substrate. This embodiment is particularly useful when the application requires a high erosion resistance of the coating.

In another embodiment of the invention, a protected article comprises a substrate, a metallic bond coat on the substrate, a top layer of alpha alumina, and a second ceramic material layer between the bond coat and the top layer of alpha alumina. The second ceramic material layer could be, for example, conventional yttria-stabilized zirconia or other ceramic. This embodiment takes advantage of the oxygen-diffusion-barrier qualities of the alpha alumina and its erosion and impact resistance by placing the top layer of the alpha alumina over the second ceramic material.

The present invention utilizes alpha alumina as the primary thermal barrier coating material or as an overcoat over another ceramic in the thermal barrier coating. The alpha alumina is stronger and more erosion resistant than conventional materials such as YSZ at elevated temperatures. The alpha alumina also exhibits impact resistance and fracture toughness superior to the YSZ. Alpha alumina has the additional important advantage that it can be toughened and made less susceptible to cracking by transformation toughening procedures. The transformation toughening is achieved by mixing other ceramics such as zirconia with the alpha alumina. The alpha alumina can also be mixed with ceramics such as nickel oxide, magnesium oxide, chromium oxide, titanium oxide, and yttrium oxide to create spinels and graded ceramic structures.

The present invention is limited to the use of alpha alumina rather than other forms of alumina. When other forms of alumina are deposited or are present, they can be expected to experience phase transformations during service to a more stable form. These phase transformations are accompanied by volume changes, which in turn can lead to wrinkling, cracking, or spalling of the ceramic coating, a major disadvantage.

The invention also extends to a method for preparing the coated articles. In accordance with this aspect of the invention, a method for preparing a protected article comprises the steps of providing a substrate, applying a bond coat to the substrate, and depositing a layer of alpha alumina onto the bond-coated substrate. During the deposition of the alpha alumina, the bond-coated substrate is heated to a temperature of at least about 1800° F., and more preferably to a temperature of about 2000° F., while the alpha alumina is being deposited thereon.

This deposition technique can be adapted to the structures discussed previously, as well as others. For example, the layer of alpha alumina can be deposited overlying and directly onto the bond coat with no further ceramic material layer deposited thereover. A layer of a second ceramic material can be deposited over the bond coat, and the layer of alpha alumina deposited over the layer of the second ceramic material. In another application, the layer of alpha alumina can be deposited overlying and directly onto the bond coat, and a layer of a second ceramic material deposited overlying the layer of alpha alumina. In each case, the bond-coated substrate is heated to at least 1800° F., and preferably to 2000° F., while the alpha alumina is deposited (but not necessarily when other ceramic layers are deposited). Deposition of the alpha alumina is preferably accomplished in all cases by electron beam physical vapor deposition.

The present invention provides an advance in the art of thermal barrier coating systems for protecting substrates. It is most advantageously used with nickel-base superalloys that are used in gas turbine engine applications. Other features and advantages of the present invention will be apparent from the following more detailed description of the preferred embodiment, taken in conjunction with the accompanying drawings, which illustrate, by way of example, the principles of the invention.

DETAILED DESCRIPTION OF THE INVENTION

Figure 1:
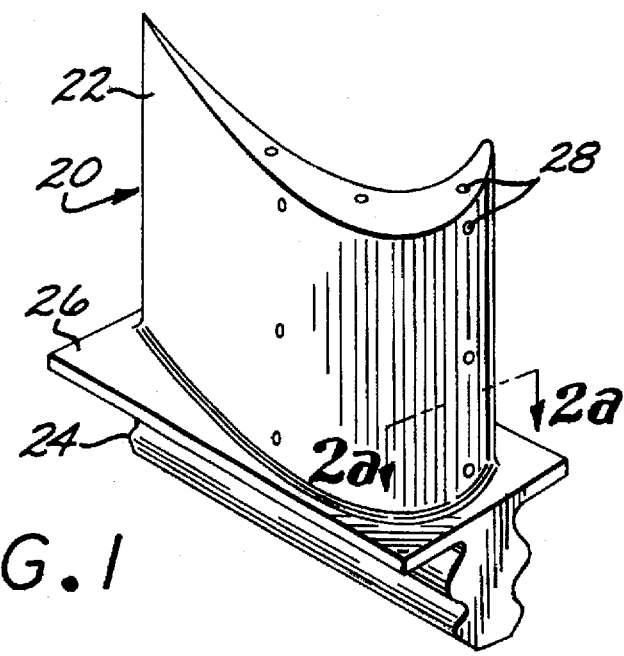
FIG. 1 is a perspective view of a protected article.

The protective approach of the invention can be used in conjunction with various articles. FIG. 1 depicts one such article by way of example, a component of a gas turbine engine such as a turbine blade or turbine vane. In this case the article is depicted as a turbine blade 20. The turbine blade 20 includes an airfoil 22 against which the flow of hot exhaust gas is directed. The turbine blade 20 is mounted to a turbine disk (not shown) by a dovetail 24 which extends downwardly from the airfoil 22 and engages a slot on the turbine disk. A platform 26 extends longitudinally outwardly from the area where the airfoil 22 is joined to the dovetail 24. A number of cooling channels optionally extend through the interior of the airfoil 22, ending in openings 28 in the surface of the airfoil 22. A flow of cooling air is directed through the cooling channels, to reduce the temperature of the airfoil 22.

Figure 2A:
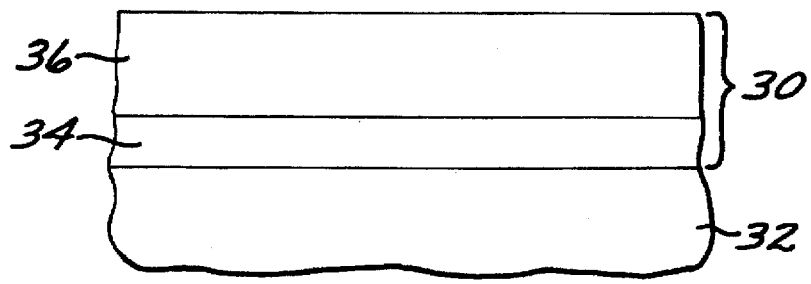
FIG. 2(a) is a schematic sectional view through the article of FIG. 1, taken generally along line 2—2, illustrating a first embodiment of a protective coating system on the surface of the article.
Figure 2B:
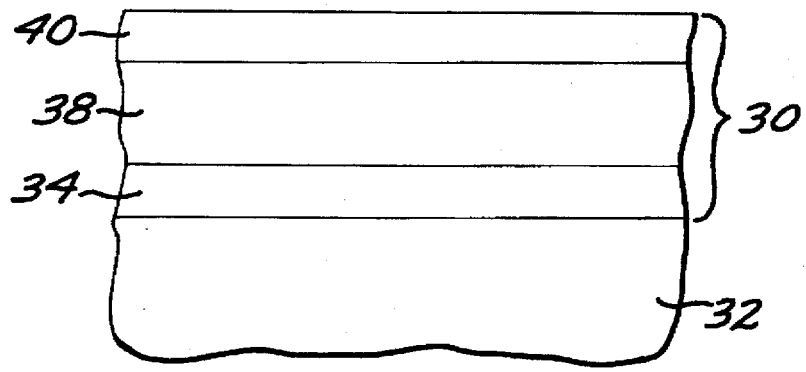
FIG. 2(b) is a schematic sectional view through the article of FIG. 1, taken generally along line 2—2, illustrating a second embodiment of a protective coating system on the surface of the article.

FIGS. 2(a) and 2(b) respectively illustrate two embodiments of a protective system 30 deposited upon the turbine blade 20, which thereby acts as a substrate 32. (These figures are not drawn to scale.) The substrate 32 may be formed of any operable material, but a preferred base metal from which the article substrate is formed is a nickel-base superalloy. A preferred superalloy has a nominal composition in weight percent of 13 percent cobalt, 6 percent chromium, 6 percent aluminum, and 3 percent rhenium, balance nickel, but other superalloys such as Rene N5 can be used. The substrate 32 may be prepared in any operable manner, and may be a polycrystal, an aligned polycrystal, or a single crystal.

The protective system 30 includes a bond coat 34 deposited overlying and directly contacting the substrate 32. The bond coat 34 aids in adhering the overlying structure to the substrate, both initially and during service. The bond coat desirably has a coefficient of thermal expansion intermediate that of the substrate and the overlying structure. The bond coat also preferably contains aluminum in an amount sufficient to form an aluminum oxide scale over the bond coat, either in an initial oxidation or during service. The bond coat may be of any operable composition, including, for example, an alloy of the NiCrAlY or CoCrAlY type or a platinum aluminide. The bond coat 34 is preferably from about 0.002 to about 0.004 inches thick, and is preferably deposited by low pressure plasma spray or chemical vapor deposition.

One or more layers of ceramic overlies the bond coat. Two preferred embodiments of the overlying structure are illustrated in FIGS. 2(a) and 2(b), respectively.

The protective system 30 of the embodiment of FIG. 2(a) includes a layer 36 of alpha alumina ceramic deposited overlying and directly contacting the bond coat 34. There is preferably no further layer overlying the layer 36 in this embodiment. The conventional yttria-stabilized zirconia (YSZ) ceramic material is a better insulator per unit thickness than alpha alumina, but the alpha alumina is much lighter per unit thickness than YSZ. Stated alternatively, the alpha alumina may be made much thicker than the YSZ for an equivalent weight. The use of a thicker layer of alpha alumina rather than a thinner layer of YSZ to achieve thermal protection of the substrate has the advantage that it is more erosion resistant. The higher thermal conductivity of alpha alumina can be somewhat offset by depositing the layer 36 by electron beam physical vapor deposition, which leaves a degree of porosity in the layer 36 that reduces its thermal conductivity. Thus, the layer 36 of alpha alumina is preferably from about 0.002 inches to about 0.015 inches, most preferably from about 0.005 inches to about 0.010 inches, thick. Thicker and thinner layers are also operable.

Additionally, alpha alumina has the advantage that it is more resistant to impact and erosion damage than YSZ. A thick layer of alpha alumina provides excellent impact and erosion resistance to the substrate 32. The deposited alpha alumina is compatible with the aluminum oxide scale that can be, and usually is, present at the interface between the bond coat 34 and the layer 36. The alpha alumina is resistant to diffusion of oxygen therethrough, and therefore tends to protect the substrate against oxidation. The alpha alumina is strong and hard at elevated temperatures.

Additionally, alpha alumina can be transformation toughened by the addition of small amounts of additional constituents mixed into the alpha alumina. The addition of about 25 percent by weight of zirconia to alpha alumina increases its fracture toughness to about 8 ksi-root inches. Additions of other oxides to alpha alumina such as nickel oxide, magnesium oxide, titanium oxide, and yttrium oxide can also be made to the alpha alumina to create spinels and graded ceramic structures.

The layer 36 must be alpha alumina, a rhombohedral form, rather than other forms of alumina such as gamma (cubic) alumina. Alpha alumina is thermodynamically stable at elevated temperatures, even above about 2000° F., whereas other forms of alumina will transform to more stable forms during elevated temperature exposure. The transformation observed in other forms of alumina is accompanied by a volume change, leading to deformation, wrinkling, and/or failure by spalling of the layer. The alpha alumina form is chosen to avoid the occurrence of such transformations.

In the embodiment of FIG. 2(b), which is the presently most preferred embodiment, a layer 38 of a second ceramic is deposited overlying and directly contacting the bond coat 34. The layer 38 is formed of a ceramic other than alpha alumina, such as YSZ or cerium oxide. The layer 38 is preferably from about 0.002 inches to about 0.015 inches thick. A top layer 40 of alpha alumina is deposited overlying and directly contacting the layer. The top layer 40 is preferably from about 0.00025 inches to about 0.004 inches thick. This embodiment combines the good thermal insulative properties of YSZ or other low-conductivity ceramics with the erosion/impact resistance of alpha alumina. The alpha alumina also serves as a corrosion-resistant layer against deposits containing vanadium which are often observed in industrial and marine gas turbine engines.

Figure 3:
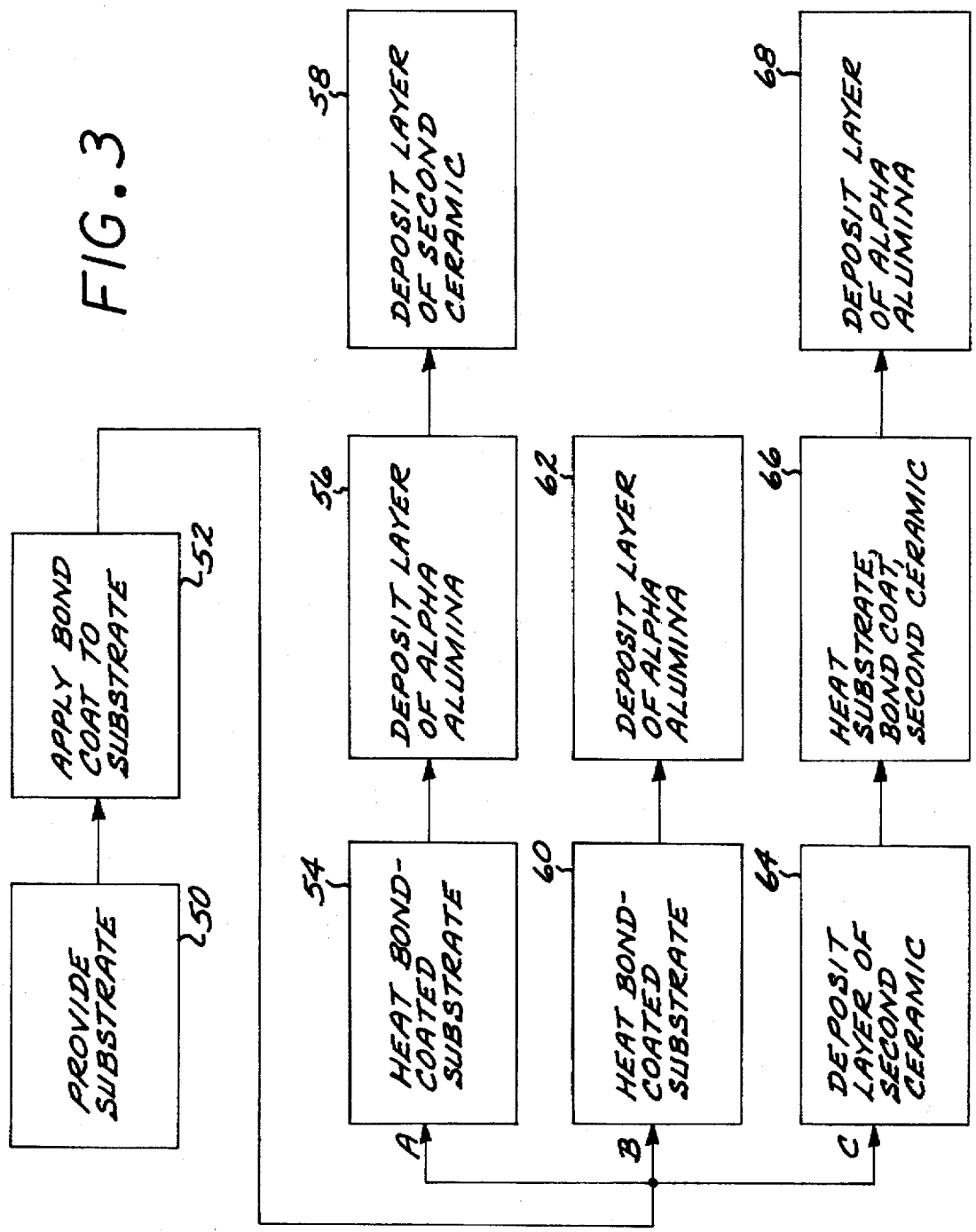
FIG. 3 is a block diagram depicting three methods practiced according to the invention.

FIG. 3 depicts three embodiments of a method for preparing a protected substrate. In all embodiments, the substrate 32 is provided, numeral 50, and the bond coat 34 is applied to the substrate, numeral 52. The substrate 32 and its method of preparation, and the bond coat 34 and its method of application, are as described previously.

In a first embodiment, path A, the bond-coated substrate is heated to a temperature of at least about 1800° F., and most preferably to a temperature of from about 1975° F. to about 2050° F., numeral 54. A layer of alpha alumina is deposited directly onto the bond coat 34 at this temperature, numeral 56. The layer of alpha alumina is preferably from about 0.0001 inch to about 0.005 inches thick. Deposition of the alpha alumina layer is preferably accomplished by electron beam physical vapor deposition (EBPVD). EBPVD of alumina from a molten pool to the heated substrate results in deposition of the alumina in its alpha alumina form. The use of EBPVD is preferred over other approaches to deposition of alumina, such as chemical vapor deposition (CVD) for a number of reasons. EBPVD is faster and achieves good coverage of the surface. EBPVD is performed in the same chamber as the deposition of the other ceramic layers, if used, and the bond coat in its preferred application method. Contamination due to moving the bond-coated substrate between deposition devices is thereby avoided. Additionally, EBPVD produces a desirable segmented columnar structure in the deposited alpha alumina layer, as compared with other techniques which produce a flat platelet structure in the deposited alumina layer. The segmented columnar structure is preferred for its resistance to thermal cycling damage. To complete the processing of embodiment A, a second layer of ceramic such as YSZ is deposited over the layer of alpha, numeral 58. The second layer of ceramic need not be, but may be, deposited at the same temperature as the alpha alumina layer. The layer of second ceramic is preferably from about 0.002 inches to about 0.015 inches thick.

In the resulting structure, which is not pictured, the layer of alpha alumina lies between the bond coat and the layer of second ceramic. Such a structure has been previously known and is described in U.S. Pat. No. 4,880,614. However, the present approach has the advantage over the approach described in the '614 patent that the various layers are deposited in the same deposition chamber to avoid contamination resulting from moving the substrate between deposition chambers.

In a second embodiment, path B, the substrate 32 is heated to a temperature of at least about 1800° F., and most preferably to a temperature of from about 1975° F. to about 2050° F., numeral 60. The layer 36 of alpha alumina is deposited directly onto the bond coat 34 at this temperature, numeral 62. The layer of alpha alumina is preferably from about 0.002 inches to about 0.015 inches, most preferably from about 0.005 inches to about 0.010 inches, thick. Deposition of the alpha alumina layer is preferably accomplished by EBPVD. The resulting structure corresponds to that depicted in FIG. 2(a).

In a third embodiment, path C, the layer 38 of the second ceramic is deposited, numeral 64. Deposition is by any approach suitable for the second ceramic, which is most preferably YSZ. The layer 38 is preferably from about 0.002 inches to about 0.015 inches thick. The coated substrate 32 is heated to a temperature of at least about 1800° F., and most preferably to a temperature of from about 1975° F. to about 2050° F., numeral 66. A layer 40 of alpha alumina is deposited directly onto the second ceramic layer 38 at this temperature, numeral 68. The layer of alpha alumina is preferably from about 0.00025 inches to about 0.004 inches thick. Deposition of the alpha alumina layer is preferably accomplished by EBPVD. The resulting structure corresponds to the most preferred structure depicted in FIG. 2(b).

The approach of the third embodiment has been reduced to practice. In this reduction, the substrate was Rene N5 nickel-based superalloy, and the bond coat was platinum aluminide. About 0.005 inches of YSZ was deposited overlying and contacting the bond coat. About 0.001–0.002 inches of alpha alumina was deposited overlying the YSZ by EBPVD with the coated substrate at a temperature of about 1850° F. The erosion resistance of this material was measured by blasting the surface of the alpha alumina layer 40 with 100 grams of alumina grit of 50 micrometer particle size carried in 25 pounds per square inch air at a flow rate of 98 feet per second and at a 90 degree impact angle. The penetration depth was about 0.002 inches. By comparison, YSZ material tested by the same approach exhibited a penetration depth of about 0.0034 inches. The furnace cycle test life of the materials was about the same.

This invention has been described in connection with specific embodiments and examples. However, those skilled in the art will recognize various modifications and variations of which the present invention is capable without departing from its scope as represented by the appended claims.

What is claimed is:

1. A method for preparing a protected article, comprising the steps of:

providing a substrate;

applying a bond coat to the substrate; and depositing a layer of alpha alumina by electron beam physical vapor deposition onto the bond-coated substrate, the step of depositing including the step of heating the bond-coated substrate to a temperature of at least about 1800° F. while the alpha alumina is being deposited thereon.

2. The method of claim 1, wherein the step of depositing includes the steps of heating the bond-coated substrate to a temperature of at least about 1800° F.;

depositing a layer of alpha alumina directly onto the bond coat; and depositing a layer of a second ceramic material overlying the layer of alpha alumina.

3. The method of claim 1, wherein the step of depositing includes the steps of heating the bond-coated substrate to a temperature of at least about 1800° F.; and depositing a layer of alpha alumina directly onto the bond coat with no further ceramic material layer deposited thereover.

4. The method of claim 1, wherein the step of depositing includes the steps of depositing a layer of a second ceramic material over the bond coat;

heating the substrate, bond coat, and layer of second ceramic material to a temperature of at least about 1800° F.; and depositing a layer of alpha alumina over the layer of the second ceramic material.

5. The method of claim 1, wherein the step of applying a bond coat includes the step of applying a metallic bond coat to the substrate.

6. A method for preparing a protected article, comprising the steps of:

providing a substrate;

applying a bond coat to the substrate;

providing a deposition source of alpha alumina; and depositing a layer of alpha alumina from the deposition source of alpha alumina onto the substrate, the step of depositing including the step of heating the bond-coated substrate to a temperature of at least about 1800° F. while the alpha alumina is being deposited thereon.

7. A method for preparing a protected article, comprising the steps of:

providing a substrate;

applying a bond coat to the substrate;

providing a deposition source of alpha alumina; and depositing a layer of alpha alumina from the deposition source of alpha alumina onto the substrate, the step of depositing including the step of heating the bond-coated substrate to a temperature of at least about 1800° F. while the alpha alumina is being deposited thereon, wherein the step of depositing a layer of alpha alumina includes the step of depositing the layer of alpha alumina from about 0.0001 inch to about 0.005 inch thick.

8. The method of claim 7, including an additional step, after the step of depositing a layer of alpha alumina, of depositing a layer of a second ceramic overlying the layer of alpha alumina.

9. The method of claim 7, including an additional step, after the step of depositing a layer of alpha alumina, of depositing a layer of yttria-stabilized zirconia overlying the layer of alpha alumina.

10. The method of claim 7, including an additional step, after the step of applying a bond coat and before the step of depositing a layer of alpha alumina, of depositing a layer of a second ceramic overlying the bond coat.

11. The method of claim 7, wherein the step of depositing a layer of alpha alumina includes the step of depositing the layer of alpha alumina by electron beam physical vapor deposition.

12. The method of claim 7, wherein the step of applying a bond coat includes the step of applying a metallic bond coat to the substrate.

13. A method for preparing a protected article, comprising the steps of:

providing a substrate;

applying a bond coat to the substrate;

providing a deposition source of alpha alumina; and depositing a layer of alpha alumina from the deposition source of alpha alumina onto the substrate, the step of depositing including the step of heating the bond-coated substrate to a temperature of at least about 1800° F. while the alpha alumina is being deposited thereon, wherein the step of depositing a layer of alpha alumina includes the step of depositing the layer of alpha alumina from about 0.005 inch to about 0.010 inch thick.

14. The method of claim 13, including an additional step, after the step of depositing a layer of alpha alumina, of depositing a layer of a second ceramic overlying the layer of alpha alumina.

15. The method of claim 13, including an additional step, after the step of depositing a layer of alpha alumina, of depositing a layer of yttria-stabilized zirconia overlying the layer of alpha alumina.

16. The method of claim 13, including an additional step, after the step of applying a bond coat and before the step of depositing a layer of alpha alumina, of depositing a layer of a second ceramic overlying the bond coat.

17. The method of claim 13, wherein the step of depositing a layer of alpha alumina includes the step of depositing the layer of alpha alumina by electron beam physical vapor deposition.

18. The method of claim 13, wherein the step of applying a bond coat includes the step of applying a metallic bond coat to the substrate.

* * * * *